United States Patent
Saito et al.

(10) Patent No.: US 8,872,738 B2
(45) Date of Patent: Oct. 28, 2014

(54) DISPLAY DEVICE

(75) Inventors: Nobuyoshi Saito, Kanagawa-ken (JP);
Tomomasa Ueda, Kanagawa-ken (JP);
Hajime Yamaguchi, Kanagawa-ken (JP); Kentaro Miura, Kanagawa-ken (JP); Shintaro Nakano, Kanagawa-ken (JP); Tatsunori Sakano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 279 days.

(21) Appl. No.: 13/238,339

(22) Filed: Sep. 21, 2011

(65) Prior Publication Data
US 2012/0242562 A1 Sep. 27, 2012

(30) Foreign Application Priority Data
Mar. 24, 2011 (JP) ................. 2011-065272

(51) Int. Cl.
*G09G 3/30* (2006.01)
*H01L 27/12* (2006.01)
*G09G 3/32* (2006.01)

(52) U.S. Cl.
CPC ........ *H01L 27/1225* (2013.01); *G09G 2300/08* (2013.01); *G09G 2300/0408* (2013.01); *G09G 3/3233* (2013.01)
USPC .............................. 345/76; 345/690; 345/212

(58) Field of Classification Search
USPC .......................................................... 345/76
See application file for complete search history.

(56) References Cited

U.S. PATENT DOCUMENTS

| 8,334,959 | B2 * | 12/2012 | Hirabayashi et al. | 349/149 |
| 8,618,462 | B2 * | 12/2013 | Kimura et al. | 250/214 R |
| 2005/0110725 | A1 * | 5/2005 | Kwak et al. | 345/76 |
| 2006/0232601 | A1 | 10/2006 | Kimura et al. | |
| 2007/0046590 | A1 * | 3/2007 | Umezaki et al. | 345/76 |
| 2007/0200803 | A1 | 8/2007 | Kimura | |
| 2009/0015578 | A1 | 1/2009 | Fish et al. | |
| 2011/0122164 | A1 * | 5/2011 | Kimura et al. | 345/690 |

FOREIGN PATENT DOCUMENTS

JP 7-273542 A 10/1995
(Continued)

OTHER PUBLICATIONS

Machine translation of JP2004-126139.*
(Continued)

*Primary Examiner* — Lixi C Simpson
(74) *Attorney, Agent, or Firm* — Oblon, Spivak, McClelland, Maier & Neustadt, L.L.P.

(57) ABSTRACT

According to one embodiment, a display device includes an insulating layer, a display unit, and an organic EL layer. The display unit is provided on a major surface of the insulating layer and includes a plurality of gate lines, a plurality of signal lines, a plurality of power source lines and a plurality of pixel units arranged in a matrix configuration. The EL layer is provided on the display unit. Each pixel unit includes a drive transistor and a resistor. The drive transistor includes a drive gate electrode, a drive source electrode, and a drive drain electrode. The drive source electrode or the drive drain electrode is connected to one of the power source lines. An end of the resistor is connected to the drive gate electrode. An other end of the resistor is connected to one of the gate line, the signal line, and the power source line.

16 Claims, 6 Drawing Sheets

(56) References Cited

FOREIGN PATENT DOCUMENTS

| | | |
|---|---|---|
| JP | 2001-284623 A | 10/2001 |
| JP | 2002-72923 A | 3/2002 |
| JP | 2002-297097 A | 10/2002 |
| JP | 2003-186436 A | 7/2003 |
| JP | 2003-280556 | 10/2003 |
| JP | 2004-126139 | 4/2004 |
| JP | 2006-17967 A | 1/2006 |
| JP | 2006-245557 | 9/2006 |
| JP | 2006-278243 A | 10/2006 |
| JP | 2007-518112 | 7/2007 |
| JP | 2008-123948 A | 5/2008 |
| JP | 2008-216529 A | 9/2008 |
| KR | 10-2006-0064992 A | 6/2006 |
| KR | 10-2010-0038181 | 4/2010 |

OTHER PUBLICATIONS

Soon-Kwang Hong, et al. "Invited Paper: LTPS Technology for Improving the Uniformity of AMOLEDs", SID 07 Digest, 2007, pp. 1366-1369.

Korean Office Action issued Sep. 1, 2013 in Patent Application No. 10-2013-0070936 with English Translation.

Korean Office Action issued Mar. 20, 2013, in Patent Application No. 10-2011-0096126 (with English-language translation).

Japanese Office Action issued May 16, 2014 in Patent Application No. 2011-065272 with English Translation.

Chinese Office Action issued Apr. 24, 2014, in China Patent Application No. 201110285393.1 (with English Translation).

Office Action issued Aug. 4, 2014 in Taiwanese Patent Application No. 100134624 (with English Translation).

* cited by examiner

DISPLAY DEVICE

CROSS-REFERENCE TO RELATED APPLICATIONS

This application is based upon and claims the benefit of priority from the prior Japanese Patent Application No. 2011-065272, filed on Mar. 24, 2011; the entire contents of which are incorporated herein by reference.

FIELD

Embodiments described herein relate generally to a display device.

BACKGROUND

Organic electroluminescence (EL) display devices, which are self-luminous elements, draw attention these days as flat display devices, and are actively researched. Since the organic EL display device uses a self-luminous element, it has features such as requiring no backlight, having a wide viewing angle of the image, and having high-speed responsiveness to be suitable for video reproduction, as compared to liquid crystal display devices in which the intensity of the transmitted light from a backlight is controlled by a liquid crystal cell including a pixel circuit.

The organic EL display device can use a simple (passive) matrix system and an active matrix system as the driving system of the device similarly to liquid crystal display devices. In the active matrix system, the current flowing through an organic EL element is controlled by an active element, such as a thin-film transistor, provided in the same pixel circuit as that of the organic EL element. The active matrix display device can perform large-size and high-definition display.

In the active matrix organic EL display device, each pixel includes a drive transistor connected in series to the organic EL element and a write transistor that writes a signal voltage in accordance with the image signal on the gate of the drive transistor. The drive transistor operates as a constant current source corresponding to the image signal. Hence, to ensure the uniformity of display, it is required to suppress the characteristic variation of the drive transistor between pixels to a very small level.

DETAILED DESCRIPTION

In general, according to one embodiment, a display device includes an insulating layer, a display unit, and an organic EL layer. The display unit is provided on a major surface of the insulating layer and includes a plurality of gate lines, a plurality of signal lines, a plurality of power source lines and a plurality of pixel units arranged in a matrix configuration. The organic EL layer is provided on the display unit. Each pixel unit includes a drive transistor and a resistor. The drive transistor includes a drive gate electrode, a drive source electrode, and a drive drain electrode. The drive source electrode or the drive drain electrode is connected to one of the power source lines. An end of the resistor is connected to the drive gate electrode, and an other end of the resistor is connected to one of the gate line, the signal line, and the power source line.

Various embodiments will described hereinafter with reference to the accompanying drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification of this application and the drawings, components similar to those described in regard to a drawing therein above are marked with the same reference numerals, and a detailed description is omitted as appropriate. An active matrix organic EL display device is used as the display device.

First Embodiment

A display device according to a first embodiment is described.

Figure 1:
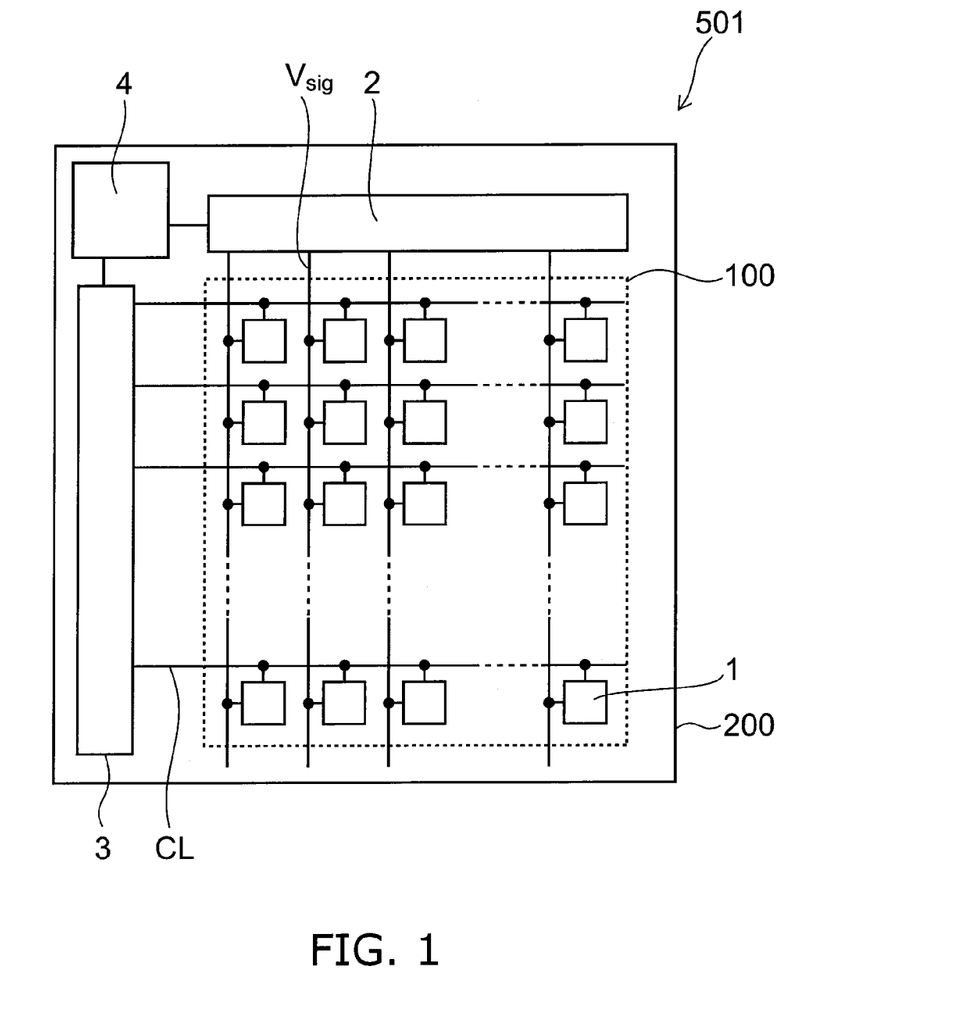
FIG. 1 shows a plan view of a display device according to a first embodiment.

FIG. 1 shows a plan view of the display device 501.

The display device 501 according to the embodiment includes a display region 100 (a display unit) in which images are displayed and a peripheral region 200 (a peripheral unit) that is a region other than the display region.

The display region 100 includes pixel units 1. The peripheral region 200 includes a signal line drive circuit 2, a control line drive circuit 3, and a controller 4. The controller 4 is connected to the signal line drive circuit 2 and the control line drive circuit 3, and performs the timing control of the operation of the signal line drive circuit 2 and the control line drive circuit 3.

The signal line drive circuit 2 is connected to the pixel units 1 by a plurality of signal lines Vsig provided along the column direction in FIG. 1. The control line drive circuit 3 is connected to the pixel units 1 by a plurality of control lines CL provided along the row direction in FIG. 1. The signal line drive circuit 2 supplies a signal voltage corresponding to the image signal to the pixel unit 1 through the signal line Vsig. The control line drive circuit 3 supplies a scan line drive signal to the pixel unit 1 through the control line CL.

The pixel unit 1 includes an organic EL element that emits light based on the current supplied and the like.

Figure 2:
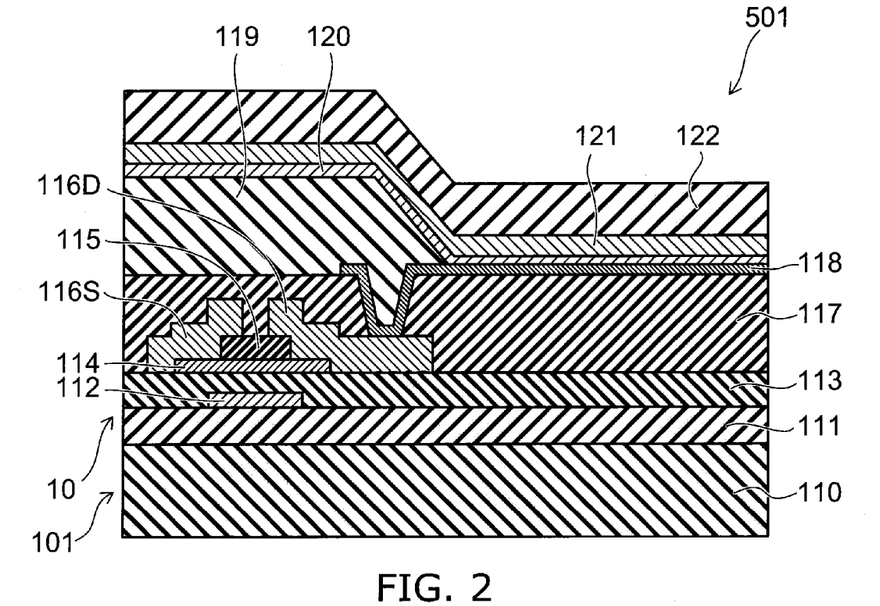
FIG. 2 is a view showing a partial cross section of the display region of the display device according to the first embodiment.

FIG. 2 is a view showing a partial cross section of the display region of the display device 501 according to the first embodiment.

An array barrier film 111 is provided on a substrate 110 of the display device 501. A thin-film transistor (TFT) 10 is provided on part of the array barrier film 111. More specifically, a gate electrode 112 is provided on part of the array barrier film 111. A gate insulating film 113 is provided so as to cover the gate electrode 112. A semiconductor layer 114 is provided on part of the gate insulating film 113 so as to overlap with the position of the gate electrode 112. A channel protection film 115 is provided on the semiconductor layer 114, except for the source contact region and the drain contact region. A source electrode 116S is provided on the source contact region of the semiconductor layer 114, and a drain electrode 116D is provided on the drain contact region of the semiconductor layer 114.

A TFT protection film 117 is provided on the source electrode 116S, the drain electrode 116D, and the gate insulating film 113. A pixel electrode 118 is provided on part of the TFT protection film 117. The pixel electrode 118 is connected to the drain electrode 116D through a bank provided in the TFT protection film 117. An organic EL layer 120 is provided on the pixel electrode 118. A common electrode 121 is provided on the organic EL layer 120. In a region above the thin-film transistor 10, the organic EL layer 120 and the common electrode 121 are provided above the TFT protection film 117 via a passivation film 119. A sealing film 122 is provided on the common electrode 121.

An insulative substrate such as a glass substrate and a plastic substrate, for example, may be used as the substrate 110. As the plastic substrate, for example, PET (polyethylene terephthalate), PEN (polyethylene naphthalate), PES (polyether sulfone), PI (polyimide), and the like may be used. As the array barrier film 111, a single layer of silicon oxide ($SiO_X$, X being an arbitrary plus value) and silicon nitride ($SiN_X$, X being an arbitrary plus value) or a stacked layer thereof is used. A conductive material such as a high melting point metal, such as MoW, Ta, and W, for example, may be used for the gate electrode 112. In addition, an Al alloy containing Al treated against hillocks as a main component may be used for the gate electrode 112. Also a stacked layer of Al and a high melting point metal may be used for the gate electrode 112.

An insulative material such as silicon oxide ($SiO_X$), for example, may be used for the gate insulating film 113. In addition to silicon oxide, silicon nitride ($SiN_X$), silicon oxynitride (SiON), and the like may be used, and also a stacked film of films thereof may be used.

An In—Ga—Zn—O-based amorphous oxide semiconductor formed by the reactive sputtering method, for example, may be used for the semiconductor layer 114. Also an oxide semiconductor having another composition, polycrystalline silicon, microcrystalline silicon, amorphous silicon, an organic semiconductor, and the like may be used as the semiconductor layer 114. In the case where an amorphous oxide semiconductor is used as the semiconductor layer 114, the thickness may be set to approximately not less than 10 nm and not more than 100 nm, and is preferably approximately 10 nm in view of electrical characteristics.

An insulative material is used for the channel protection layer 115. In the case where an amorphous oxide semiconductor is used for the semiconductor layer 114, silicon oxide ($SiO_X$) having higher acid resistance than the semiconductor layer 114 may be used for the channel protection layer 115. In addition, silicon nitride ($SiN_X$), silicon oxynitride (SiON), or the like may be used as the channel protection layer 115.

Various conductive materials such as a Ti/Al/Ti stacked film and a Mo/Al/Mo stacked film, for example, may be used for the source electrode 116S and the drain electrode 116D.

Silicon oxide ($SiO_X$), silicon nitride ($SiN_X$), silicon oxynitride (SiON), aluminum oxide ($Al_2O_3$), and the like, for example, may be used for the TFT protection film 117.

At least one of indium tin oxide (ITO), a stacked structure of ITO/Ag/ITO, AZO, which is ZnO doped with Al, and the like, for example, may be used for the pixel electrode 118.

A photosensitive acrylic resin, a photosensitive polyimide, or the like, for example, may be used for the passivation film 119.

A material that emits light by voltage application may be used for the organic EL layer 120. The organic EL layer 120 is electrically connected to the pixel electrode 118.

A material such as Al and MgAg, for example, may be used for the common electrode 121.

An insulative material such as silicon nitride (SiNO, for example, may be used for the sealing film 122.

The examples of the configuration of the thin-film transistor 10 described above may be applied to the configuration of a write transistor and the configuration of a drive transistor described below. However, the connection relationships among the gate electrode, the source electrode, and the drain electrode of a transistor are determined in conformity with each transistor.

The display device 501 according to the embodiment includes an insulating layer 101, a display unit (e.g. the display region 100), and the organic EL layer 120. The array barrier film 111, for example, is used as the insulating layer 101. Also a stacked film of the substrate 110 and the array barrier film 111 may be used as the insulating layer 101. In addition, depending on circumstances, the substrate 110 may be used as the insulating layer 101.

Figure 3:
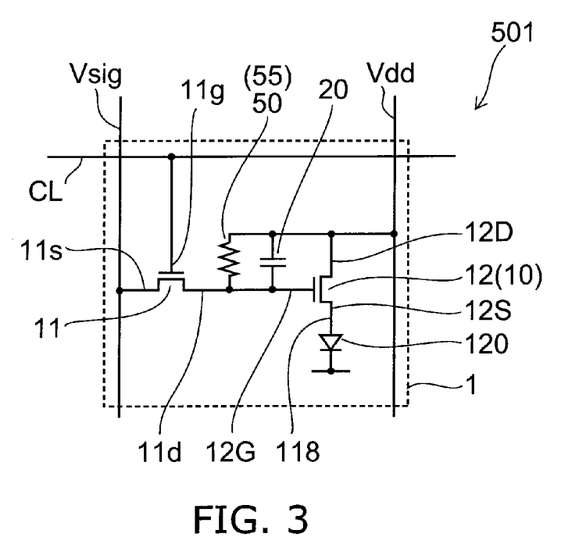
FIG. 3 shows the pixel configuration of the display device according to the first embodiment.

FIG. 3 shows the pixel configuration of the display device 501 according to the first embodiment.

Although not shown in FIG. 1, also a power source line Vdd is provided parallel to the signal line Vsig. Each pixel unit 1 includes a write transistor 11 (the thin-film transistor 10), a drive transistor 12 for current control (the thin-film transistor 10), a capacitor 20, the organic EL layer 120, and a resistance for discharge 50 (a resistor 55).

The gate electrode 11g of the write transistor 11 is connected to a gate line CL, the source electrode 11s is connected to the signal line Vsig, and the drain electrode 11d is connected to the gate electrode 12G of the drive transistor 12.

The source electrode 12S of the drive transistor 12 (a drive source electrode) is connected to the pixel electrode 118 connected to the organic EL layer 120. The drain electrode 12D of the drive transistor 12 (a drive drain electrode) is connected to the power source line Vdd. One end of the capacitor 20 and one end of the resistance for discharge 50 are connected to the gate electrode 12G of the drive transistor 12 (a drive gate electrode). The other end of the capacitor 20 and the other end of the resistance for discharge 50 are connected to the drain electrode 12D of the drive transistor 12.

The same material as that used for the semiconductor layer 114 of the write transistor 11 and the drive transistor 12, for example, may be used for the resistance for discharge 50. That is, the resistor (e.g. the resistance for discharge 50) contains the same material as that used for the semiconductor layer (e.g. the semiconductor layer 114) included in the drive transistor 12.

The inventors have found the following this time. In the active matrix organic EL display device 501, since a structure is used in which the gate electrode 12G of the drive transistor 12 is at a floating potential, the static electricity generated in manufacturing processes remains in the gate electrode 12G easily. Therefore, the characteristics of each of the drive transistors experience voltage stress deterioration based on the amount of generated static electricity and the retention state. As a consequence, a variation in characteristics has occurred between drive transistors, causing a decrease in the uniformity of display. In this regard, it has been found that the problem can be suppressed by connecting the resistor 55 for discharge (e.g. the resistance for discharge 50) to the gate electrode 12G of the drive transistor 12.

The resistor 55 (e.g. the resistance for discharge 50) mentioned above similarly carries out the role of releasing static electricity if provided in one of a position between the gate electrode 12G of the drive transistor 12 and the signal line Vsig, a position between the gate electrode 12G and the power source line Vdd, and a position between the gate electrode 12G and the gate line CL. In other words, one end of the resistor 55 (e.g. the resistance for discharge 50) is connected to the gate electrode 12G of the drive transistor 12. The other end of the resistor 55 (e.g. the resistance for discharge 50) is connected to one of the signal line Vsig and the gate line CL. Thereby, similar effects can be obtained. In other words, the other end of the resistor 55 is connected to at least one of the signal line Vsig, the power source line Vdd, and the gate line CL.

In order to obtain good discharge characteristics, it is notable that the resistance of the resistor 55 is lower than a resistance of the write transistor 11 in an OFF-state. On the other hand, in order to obtain good holding characteristics, it is notable that the resistance of the resistor 55 is more than 100 times a resistance of the write transistor 11 in an ON-state. For example, the resistance of the write transistor 11 in the OFF-state is about 1 teraohm. The resistance of the write transistor 11 in the ON-state is about 1 megaohm. Therefore, it is notable that the resistance of the resistor 55 is not less than 100 megaohms and is lower than 1 teraohm.

Second Embodiment

Figure 4:
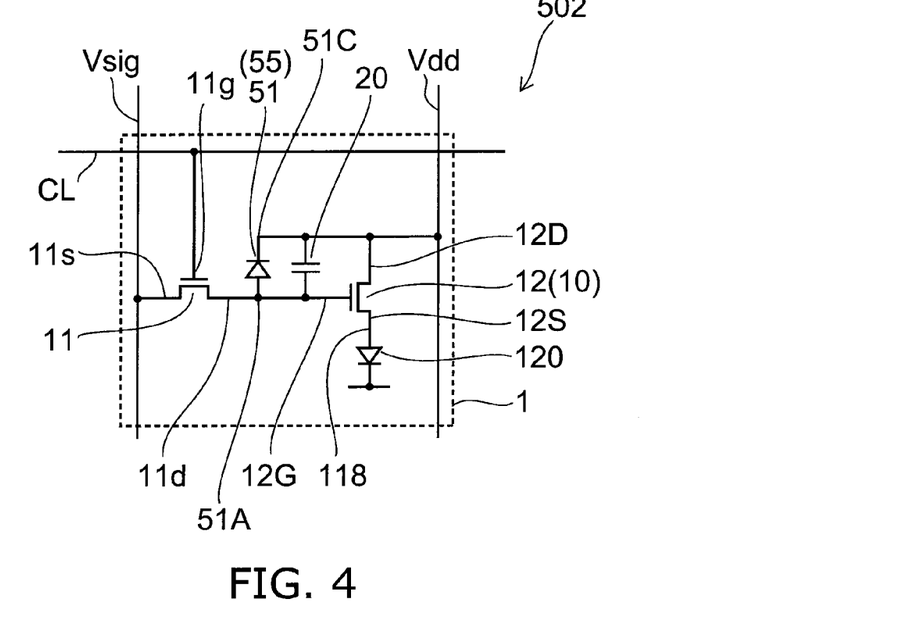
FIG. 4 is a view showing the pixel configuration of an active matrix display device according to a second embodiment.

FIG. 4 is a view showing the pixel configuration of an active matrix display device 502 according to a second embodiment.

In the second embodiment, a diode for discharge 51 is used as the resistor 55. The anode 51A of the diode for discharge 51 is connected to the gate electrode 12G of the drive transistor 12, and the cathode 51C is connected to the power source line Vdd. When the display device 502 is driven, since the electric potential of the power source line Vdd is higher than the signal potential, the diode for discharge 51 does not reduce the retention properties. Also such a configuration can prevent the characteristics of the drive transistor 12 from changing due to the static electricity caused in processes, similarly to the first embodiment.

That is, the diode for discharge 51 can contain the same material as that used for the semiconductor layer (e.g. the semiconductor layer 114) included in the drive transistor 12.

In order to obtain good discharge characteristics, it is notable that the resistance in an inverse direction of the diode for discharge 51 is lower than the resistance of the write transistor in the OFF-state. On the other hand, in order to obtain good holding characteristics, it is notable that the resistance in the inverse direction of the diode for discharge 51 is more than 100 times the resistance of the write transistor 11 in the ON-state. For example, it is notable that the resistance in the inverse direction of the diode for discharge 51 is not less than 100 megaohms and is lower than 1 teraohm.

It is notable that a resistance in a forward direction of the diode for discharge 51 is less than the resistance of the write transistor 11 when a voltage (i.e., Vgs of the write transistor 11) between the gate electrode 11g (the write gate electrode) and the source electrode 11 (the write source electrode 11s) of the write transistor 11 is zero volt.

Third Embodiment

Figure 5:
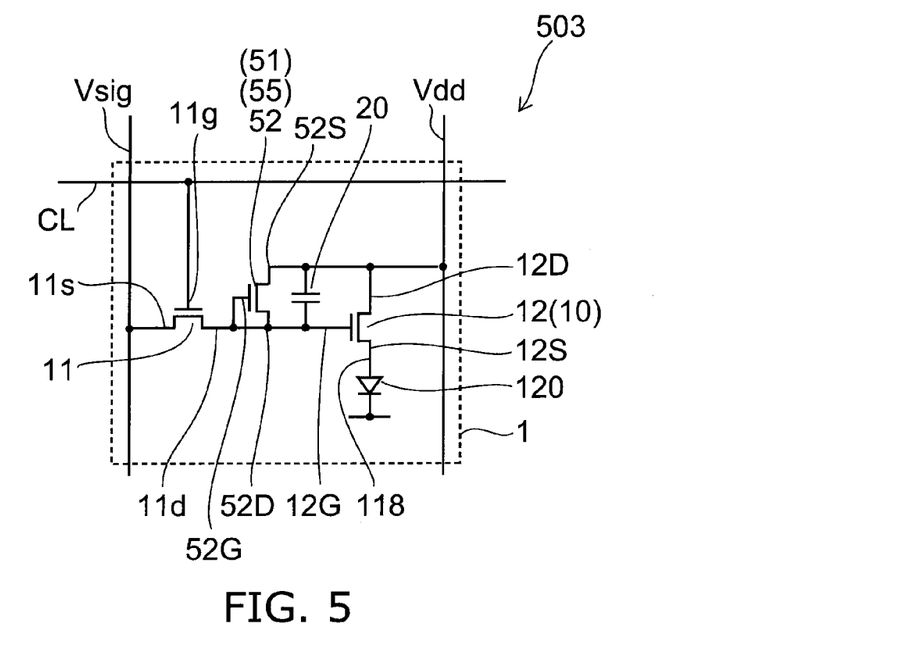
FIG. 5 is a view showing the pixel configuration of an active matrix display device according to a third embodiment.

FIG. 5 is a view showing the pixel configuration of an active matrix display device 503 according to a third embodiment.

In the third embodiment, a transistor for discharge 52 (a discharge transistor) is used as the diode for discharge 51 used as a discharger 55. The gate electrode 52G and the drain electrode 52D of the transistor for discharge 52 are connected to the gate electrode 12G of the drive transistor 12. The gate electrode 52G of the transistor for discharge 52 is electrically connected to the drain electrode 52D. The source electrode 52S of the transistor for discharge 52 is connected to the power source line Vdd.

That is, the transistor for discharge 52 can contain the same material as that used for the semiconductor layer (e.g. the semiconductor layer 114) included in the drive transistor 12.

The transistor for discharge 52 does not require an additional material and an additional process, and can be formed by the same processes as those for the write transistor 11 and the drive transistor 12.

Figure 6:
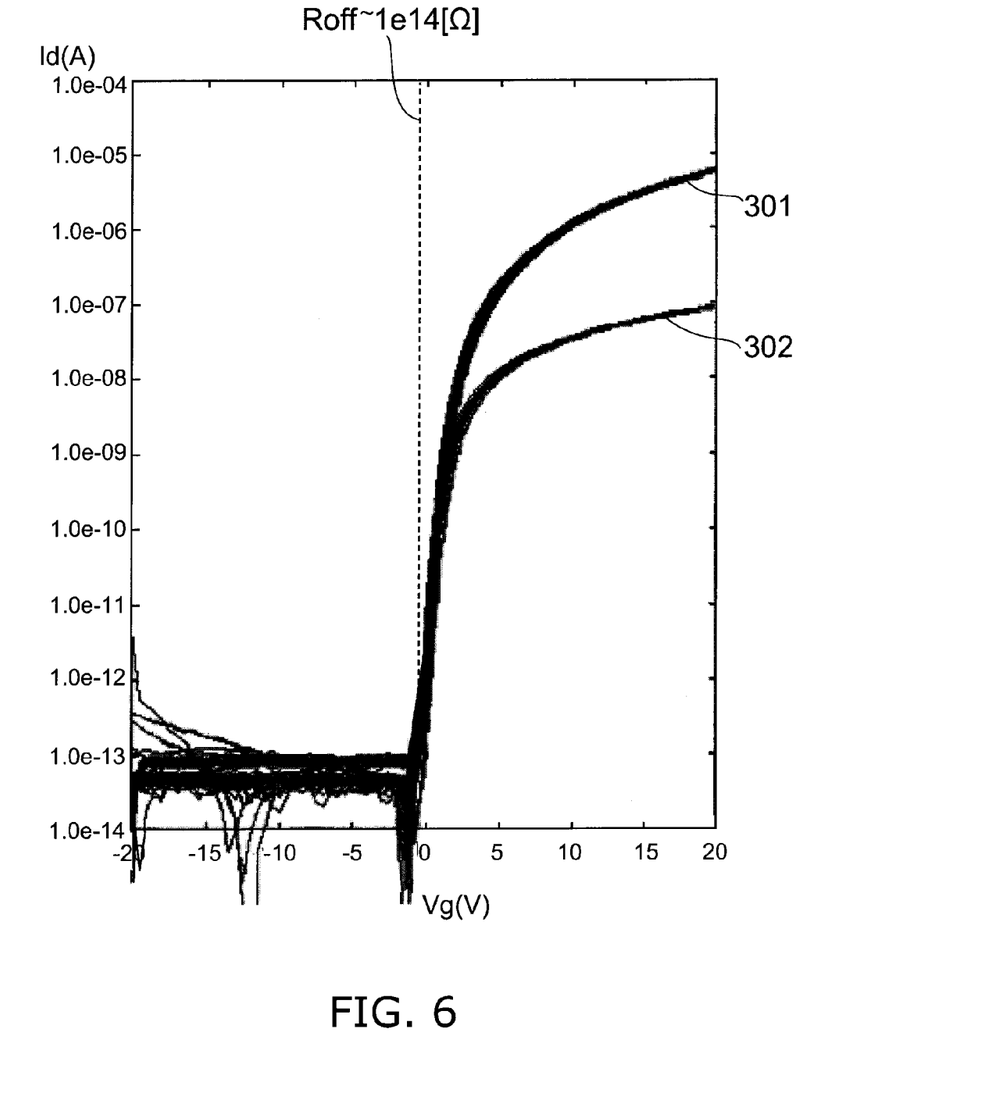
FIG. 6 is a diagram showing the TFT characteristics of an oxide semiconductor.

FIG. 6 is a diagram showing the TFT characteristics of an oxide semiconductor.

The vertical axis represents the drain current Id (ampere, A) of the drive transistor 12, and the horizontal axis represents the gate voltage (volt, V) of the drive transistor 12. A curved line 301 corresponds to the case where Vd is 15 V, and a curved line 302 corresponds to the case where Vd is 0.1 V.

As shown in FIG. 6, the TFT using an oxide semiconductor exhibits very low OFF properties as compared to TFTs based on other semiconductor materials. Therefore, in the case where the write transistor is formed of an oxide semiconductor, particularly the floating properties of the gate electrode of the drive transistor in processes are significant. Therefore, by using the configurations described in regard to the first to third embodiments and modifications of the configurations, particularly the unifomization of display is effective.

By using an oxide semiconductor for the transistor for discharge 52, a display device less susceptible to static electricity can be formed.

In this embodiment, the transistor for discharge 52 forms the diode. In order to obtain good discharge characteristics, it is notable that the resistance in an inverse direction of the diode formed with the transistor for discharge 52 is lower than the resistance of the write transistor in the OFF-state. On the other hand, in order to obtain good holding characteristics, it is notable that the resistance in the inverse direction of the diode formed with the transistor for discharge 52 is more than 100 times the resistance of the write transistor 11 in the ON-state. For example, it is notable that the resistance in the inverse direction of the diode is not less than 100 megaohms and is lower than 1 teraohm.

It is notable that a resistance in a forward direction of the diode formed with the transistor for discharge 52 is less than the resistance of the write transistor 11 when the voltage between the gate electrode 11g (the write gate electrode) and the source electrode 11 (the write source electrode 11s) of the write transistor 11 is zero volt.

Fourth Embodiment

In the embodiment, a plastic substrate is used as the substrate 110 used as an insulating layer.

Figure 7:
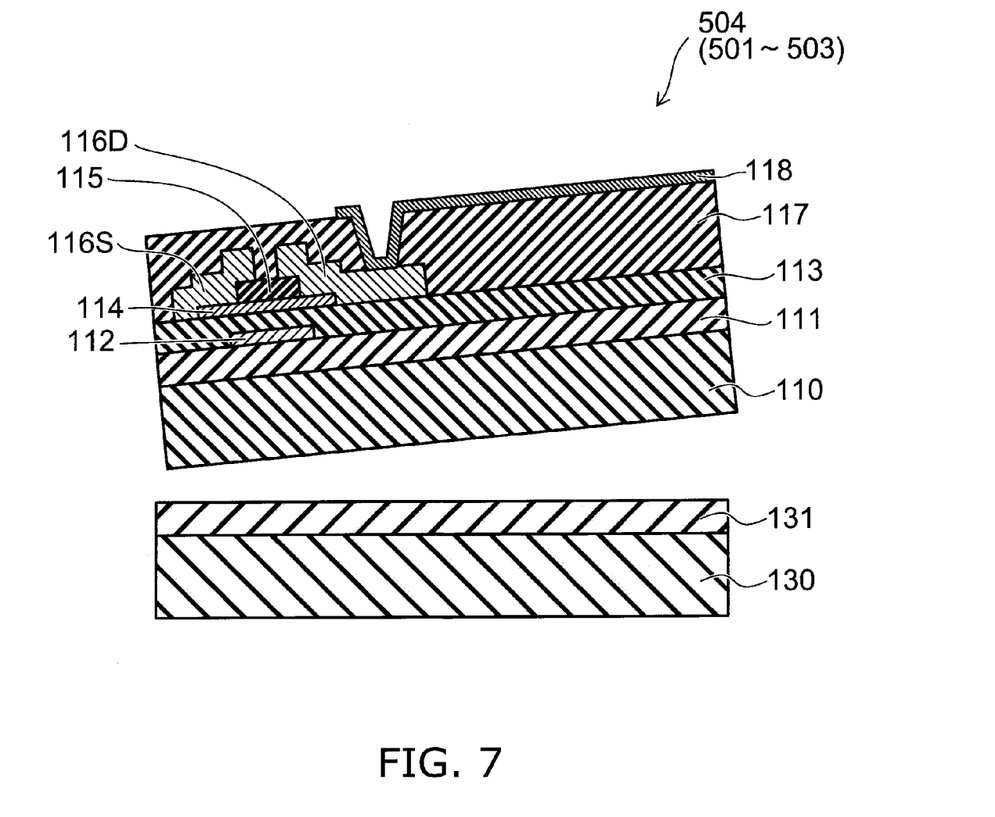
FIG. 7 is a diagram showing a process of separating the substrate.

FIG. 7 illustrates part of the manufacturing processes for the display device 504 (the display device 501-503) according to the embodiment.

In the embodiment, since the substrate 110 is plastic, when manufacturing the display device 504, the substrate 110 is temporarily attached to an adhesion layer 131 on a support substrate 130. Then, an array and display elements of the thin-film transistors 10 and the like are formed on the substrate 110 in this state. After that, the support substrate 130 and the adhesion layer 131 are divided from the substrate 110.

FIG. 7 is a cross-sectional view showing the process of separating the support substrate 130.

Figure 8:
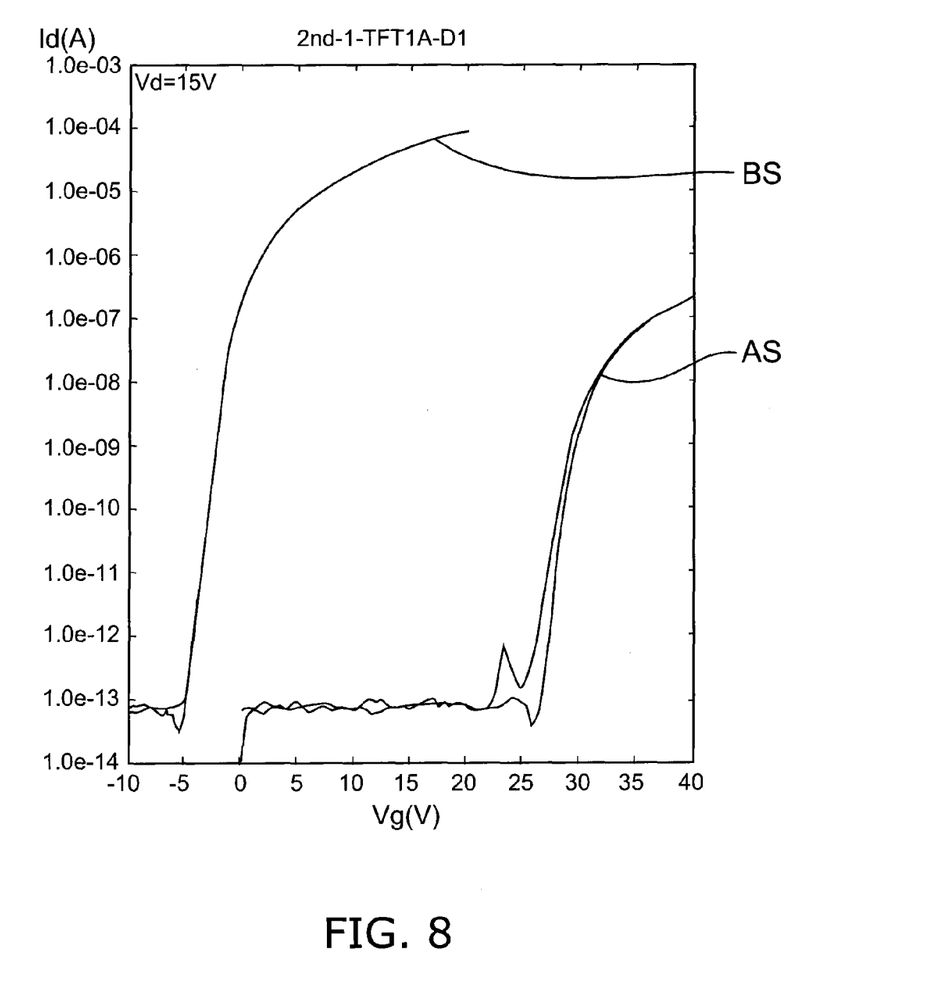
FIG. 8 is a diagram showing the characteristics of the TFT before and after the process of separating.

FIG. 8 is a diagram showing the characteristics of the TFT before and after the process of separating the plastic substrate (the substrate 110) from the support substrate 130.

The vertical axis represents the drain current Id (ampere, A) of the drive transistor 12, and the horizontal axis represents the gate voltage Vg (volt, V) of the drive transistor 12. FIG. 8 shows the characteristics BS before separating the support substrate 130 and the characteristics AS after separating it. The TFT characteristic curve after separating the support substrate 130 (the characteristics AS) is shifted to the positive direction as compared to that before separating it (the characteristics BS). In other words, the threshold voltage is shifted to the positive. When the support substrate 130 is separated, static electricity may be generated. When the support substrate 130 is separated, the static electricity may change the characteristics of the drive transistor 12 from the design values undesirably.

However, by connecting a resistor (e.g. at least one of the resistance for discharge 50, the diode for discharge 51, and the transistor for discharge 52) to the gate electrode of the drive transistor 12, the static electricity generated in the process of separating the support substrate 130 can be released. Therefore, a change in the characteristics of the drive transistor 12 can be suppressed even if the support substrate 130 is separated from the substrate 110.

Also the embodiment can prevent the characteristics of the drive transistor 12 from changing due to the static electricity caused in processes.

The embodiment can provide a display device with increased uniformity of the display of the display device.

The invention is not limited to these embodiments described above. For example, one skilled in the art may appropriately select specific configurations of components of transistors and display devices from known art and similarly practice the invention. Such practice is included in the scope of the invention to the extent that similar effects thereto can be obtained.

Further, any two or more components of the specific examples may be combined within the extent of technical feasibility and are included in the scope of the invention to the extent that the purport of the invention is included.

Moreover, all display devices practicable by an appropriate design modification by one skilled in the art based on the display devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising:
   an insulating layer;
   a display unit provided on a major surface of the insulating layer and including:
      a plurality of gate lines;
      a plurality of signal lines;
      a plurality of power source lines; and
      a plurality of pixel units arranged in a matrix configuration; and
   an organic EL layer provided on the display unit,
   each of the pixel units including:
      a drive transistor including a drive gate electrode, a drive source electrode, and a drive drain electrode, the drive drain electrode being connected to one of the power source lines, a current to flow between the drive source electrode and the drive drain electrode being configured to increase as increasing a voltage of the drive gate electrode with respect to the drive source electrode,
   a write transistor including a write gate electrode, a write source electrode, and a write drain electrode, the write gate electrode being connected to one of the gate line, the write source electrode being connected to one of the signal line, the write drain electrode being connected to the drive gate electrode, and
      a resistor including a diode having an anode and a cathode, the anode being connected to the drive gate electrode, the cathode being connected to the power source line, and
   a resistance in an inverse direction of the diode being lower than a resistance of the write transistor in an OFF-state and being more than 100 times a resistance of the write transistor in an ON-state.

2. The device according to claim 1, wherein a resistance of the resistor is lower than a resistance of the write transistor in an OFF-state and is more than 100 times a resistance of the write transistor in an ON-state.

3. The device according to claim 1, wherein a resistance of the resistor is not less than 100 megaohms and is lower than 1 teraohm.

4. The device according to claim 1, wherein the resistor contains same material as a material used for a semiconductor layer included in the drive transistor.

5. The device according to claim 1, wherein the resistor contains an oxide semiconductor.

6. The device according to claim 1, wherein a resistance in a forward direction of the diode is less than a resistance of the write transistor when a voltage between the write gate electrode and the write source electrode is zero volt.

7. The device according to claim 1, wherein the diode contains same material as a material used for a semiconductor layer included in the drive transistor.

8. The device according to claim 1, wherein the diode contains an oxide semiconductor.

9. The device according to claim 1, wherein the resistor is a discharge transistor.

10. The device according to claim 9, wherein
   the discharge transistor includes a discharge source electrode, a discharge drain electrode, and a discharge gate electrode,
   the discharge gate electrode and the discharge drain electrode are connected to the drive gate electrode,
   the discharge gate electrode is connected to the discharge drain electrode, and
   the discharge source electrode is connected to the power source line.

11. The device according to claim 10, wherein
the discharge transistor forms a diode, and
a resistance in an inverse direction of the diode is lower than a resistance of the write transistor in an OFF-state and is more than 100 times a resistance of the write transistor in an ON-state.

12. The device according to claim 11, wherein a resistance in a forward direction of the diode is less than a resistance of the write transistor when a voltage between the write gate electrode and the write source electrode is zero volt.

13. The device according to claim 10, wherein the resistor contains an oxide semiconductor.

14. The device according to claim 10, wherein the discharge transistor contains same material as a material used for a semiconductor layer included in the drive transistor.

15. The device according to claim 1, wherein
each of the pixel units further includes a capacitor,
an end of the capacitor is connected to the drive gate electrode, and
an other end of the capacitor is connected to the drive drain electrode.

16. The device according to claim 1, wherein the insulating layer is a substrate having plasticity.

* * * * *